United States Patent [19]

Matsuura

[11] Patent Number: 4,982,444
[45] Date of Patent: Jan. 1, 1991

[54] TELEVISION TUNING APPARATUS CAPABLE AS SERVING SELECTIVELY AS A UHF TUNER AND A VHF TUNER

[75] Inventor: Syuuji Matsuura, Ikoma, Japan

[73] Assignee: Sharp Kabushiki Kaisha, Osaka, Japan

[21] Appl. No.: 534,363

[22] Filed: Jun. 7, 1990

Related U.S. Application Data

[63] Continuation of Ser. No. 289,484, Dec. 21, 1988, abandoned, which is a continuation of Ser. No. 169,100, Mar. 8, 1988, abandoned, which is a continuation of Ser. No. 98,741, Sep. 16, 1987, abandoned, which is a continuation of Ser. No. 855,086, Apr. 22, 1986, abandoned.

[30] Foreign Application Priority Data

May 28, 1985 [JP] Japan .............................. 60-80476[U]

[51] Int. Cl.$^5$ .............................................. H04B 11/16
[52] U.S. Cl. ...................................... 455/188; 455/190; 358/191.1
[58] Field of Search ............... 455/180, 188, 189, 190, 455/343; 334/15; 358/191.1

[56] References Cited

U.S. PATENT DOCUMENTS

| 4,322,856 | 3/1982 | Ohta et al. | 455/190 |
| 4,633,188 | 12/1986 | Matsuta | 455/188 |

FOREIGN PATENT DOCUMENTS 0229535 11/1985 Japan .................................. 455/188

*Primary Examiner*—Gerard R. Strecker
*Assistant Examiner*—Curtis Kuntz
*Attorney, Agent, or Firm*—Flehr, Hohbach, Test, Albritton & Herbert

[57] ABSTRACT

A television tuner combining a UHF tuner and a VHF tuner employs a single mixer circuit such that a signal amplified by a UHF amplifier circuit or a VHF amplifier circuit is selectively inputted through a switching diode to this mixer circuit where it is mixed with a local oscillator signal from a UHF or VHF local oscillator circuit and converted into an intermediate frequency signal.

2 Claims, 2 Drawing Sheets

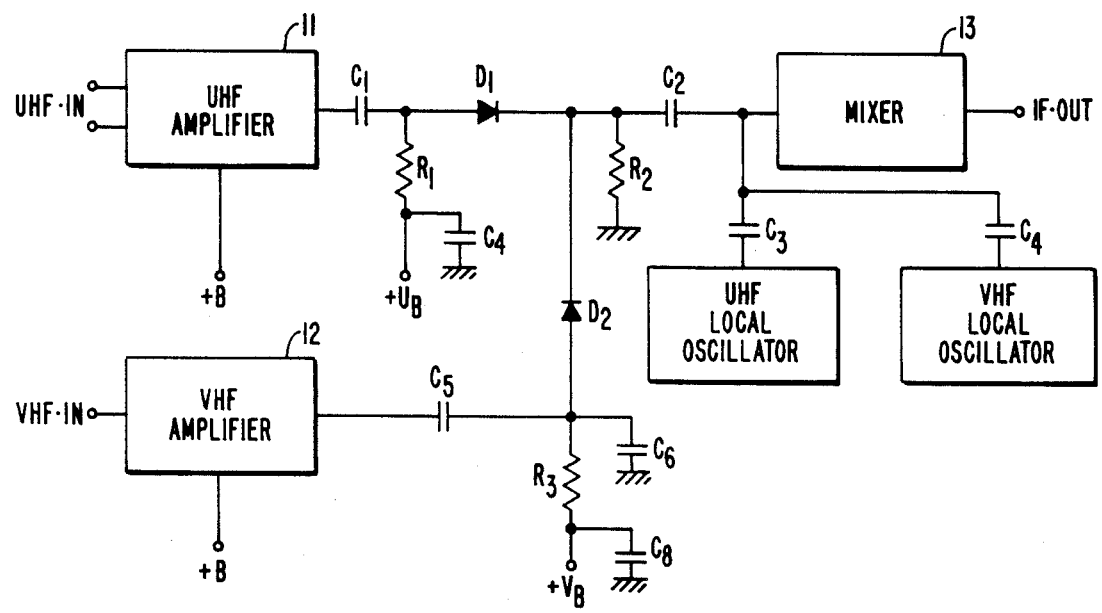
FIG.__1.
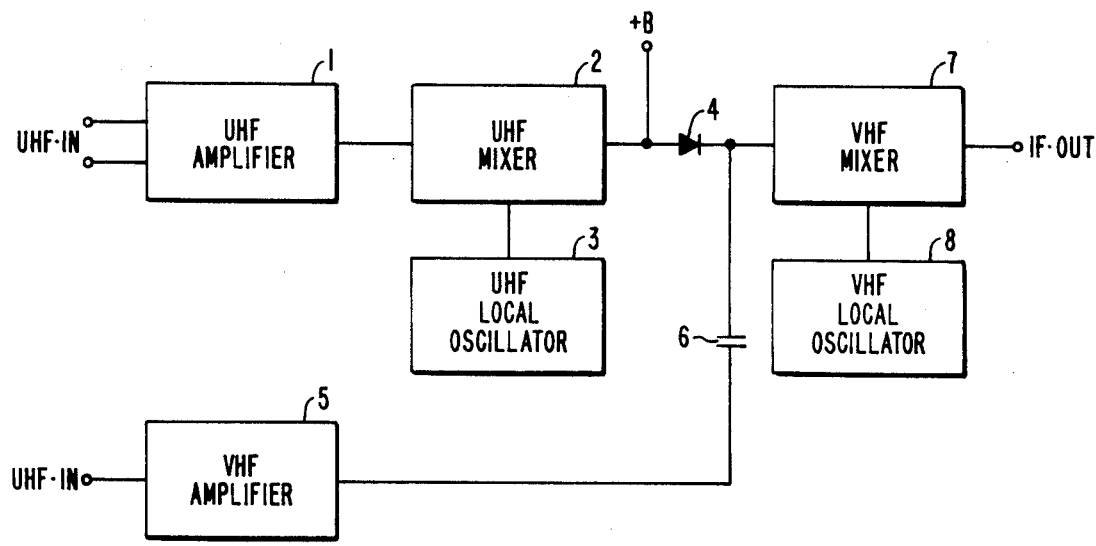
FIG.__2.

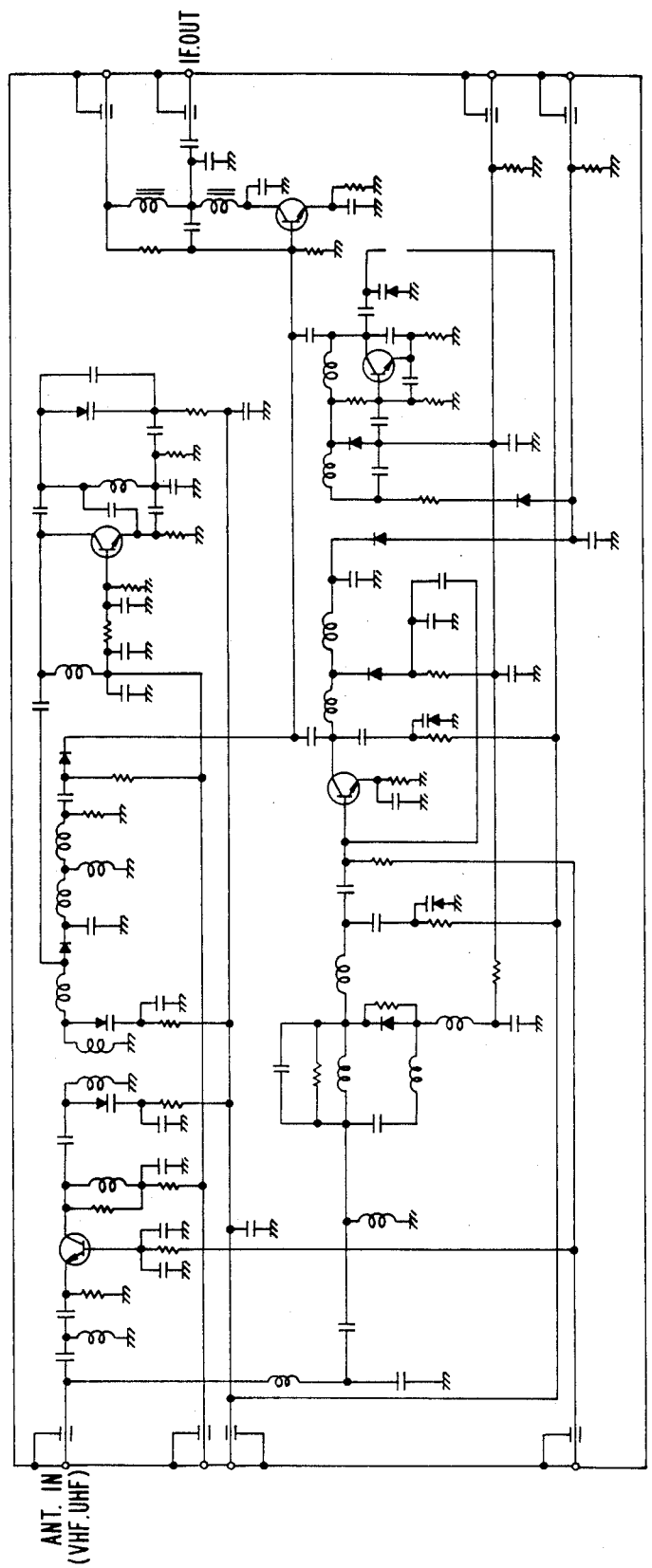
FIG._3.

TELEVISION TUNING APPARATUS CAPABLE AS SERVING SELECTIVELY AS A UHF TUNER AND A VHF TUNER

This is a continuation of application Ser. No. 289,484 filed Dec. 21, 1988, to be abandoned, which is a continuation of application Ser. No. 169,100 filed Mar. 8, 1988, now abandoned, which is a continuation of application Ser. No. 098,741 filed Sept. 16, 1987, now abandoned, which is a continuation of application Ser. No. 855,086 filed Apr. 22, 1986, now abandoned.

This invention relates to a television tuner which is structured as a combination of a UHF tuner and a VHF tuner and more particularly to a television tuner having a simple structure with a mixer circuit shared by a UHF tuner and a VHF tuner.

Reference being made to FIG. 2 which shows the structure of a television tuner combining a UHF tuner and a VHF tuner considered previously during the course of research leading to the present invention, a UHF signal which is received is tuned and amplified by a UHF amplifier 1 and is brought to a UHF mixer 2 where it is mixed with a local signal from a UHF local oscillator circuit 3. It thus becomes a UHF intermediate frequency (IF) signal and is applied to a VHF mixer circuit 7 through a switching diode 4 for making a selection between UHF and VHF. This VHF mixer circuit 7 functions as an intermediate frequency amplifier circuit at the time of a UHF reception since the VHF local oscillator circuit 8 is not operating, and the aforementioned UHF intermediate frequency signal is amplified and outputted.

If a VHF signal is received, it is tuned and amplified by a VHF amplifier 5 and applied to a VHF mixer 7 through a capacitor 6. The VHF mixer circuit 7 mixes it with a local oscillator signal from a VHF local oscillator circuit 8 and outputs it after converting it into a VHF intermediate frequency signal.

In summary, the television tuner structured as shown in FIG. 2 requires two mixer circuits separately for UHF and VHF signals. Consequently, the tuner has a large number of component parts and its structure is complicated.

It is therefore an object of the present invention to provide a television tuner combining UHF and VHF tuners which is simple in structure.

The above and other objects of the present invention are achieved by providing a television tuner which is structured as a combination of a UHF tuner and a VHF tuner but has only one mixer to be shared between its UHF and VHF amplifier circuits. Local oscillator signals from UHF and VHF local oscillators are inputted to this mixer circuit through their respective capacitors. Each signal from the UHF or VHF amplifier circuit is inputted through one of switching diodes to this mixer circuit where it becomes mixed with a corresponding local oscillator signal and results in a UHF or VHF intermediate frequency signal.

In summary, when a UHF signal is received and the UHF amplifier circuit is activated, the UHF signal amplified by this UHF amplifier circuit is transmitted to the mixer circuit through a first switching diode in the ON condition, mixed with a local oscillator signal outputted from a UHF local oscillator circuit and converted into a UHF intermediate frequency signal. When a VHF signal is received and the VHF amplifier circuit is activated, on the other hand, the VHF signal amplified by this VHF amplifier circuit is transmitted to the mixer circuit through a second switching diode in the ON condition, mixed with a local oscillator signal outputted from a VHF local oscillator circuit and converted into a VHF intermediate frequency signal. In short, one mixer circuit is used both for the UHF and VHF tuners. This reduces the number of components and simplifies the structure of the tuner.

The accompanying drawings, which are incorporated in and form a part of the specification, illustrate one embodiment of the present invention and, together with the description, serve to explain the principles of the invention. In the drawings:

FIG. 1 is a block circuit diagram of a television tuner embodying the present invention, FIG. 2 is a block circuit diagram of a television tuner considered previous to the present invention, and FIG. 3 is an example of circuit diagram of a television tuner of the type depicted in FIG. 1.

Reference being made to FIG. 1 which is a block circuit diagram of a television tuner embodying the present invention, numeral 11 indicates a UHF amplifier circuit, numeral 12 indicates a VHF amplifier circuit, numeral 13 indicates a mixer circuit for both the UHF and VHF amplifier circuits 11 and 12, numerals 14 and 15 are respectively a UHF local oscillator circuit and a VHF local oscillator circuit for applying a local oscillator signal to the mixer circuit 13 respectively through a capacitor $C_3$ and $C_4$, $D_1$ indicates a first switching diode inserted between the UHF amplifier circuit 11 and the mixer circuit 13, and $D_2$ indicates a second switching diode inserted between the VHF amplifier circuit 12 and the mixer circuit 13. The first switching diode $D_1$ is switched on by having a source voltage $+U_B$ applied to it through a resistor $R_1$. The second switching diode $D_2$ is switched on by having another source voltage $+V_B$ applied to it through another resistor $R_3$. $C_1$ and $C_2$ are capacitors for blocking direct currents, $C_5$ is a connector capacitor, and $C_6$ and $C_8$ are capacitors for grounding.

For UHF reception by the tuner of FIG. 1, the UHF amplifier circuit 11 is put in an active condition and the first switching diode $D_1$ is switched on with the source voltage $+U_B$ applied through the resistor $R_1$. In this situation, the second switching diode $D_2$ is in the OFF condition and the UHF signal which is inputted to and amplified by the UHF amplifier circuit 11 is transmitted through the first switching diode $D_1$ to the mixer circuit 13 where it becomes mixed with a local oscillator signal from the UHF local oscillator circuit 14, converted into a UHF intermediate frequency signal and outputted from its output terminal IF.OUT.

For VHF reception, the tuner is set for the VHF reception mode wherein the VHF amplifier circuit 12 is put in an active condition and the second switching diode $D_2$ is switched on with the source voltage $+V_B$ applied through the resistor $R_3$. In this situation, the first switching diode $D_1$ is in the OFF condition and the VHF signal which is inputted to and amplified by the VHF amplifier circuit 12 is transmitted through the second switching diode $D_2$ to the mixer circuit 13 where it becomes mixed with a local oscillator signal from the VHF local oscillator circuit 15, converted into a VHF intermediate frequency signal and outputted from its output terminal IF.OUT.

In summary, a tuner according to the present invention employs a single mixer circuit both for the UHF and VHF tuners. This reduces the number of components to be assembled and simplifies the structure of the tuner.

The foregoing description of a preferred embodiment of the invention has been presented for purposes of illustration and description. It is not intended to be exhaustive or to limit the invention to the precise form disclosed, and obviously many modifications and variations are possible in light of the above teaching. For example, the circuit diagram of FIG. 1 uses blocks to represent various circuit blocks. Exact circuit structures of these circuit blocks are not intended to limit the invention. FIG. 3 shows a circuit diagram of an example of television tuner depicted in FIG. 1 but this is not intended to define the scope of this invention. Modifications and variations which may be apparent to a person skilled in the art are intended to be included within the scope of this invention.

What is claimed is:

1. A television tuner comprising
   a UHF amplifier circuit outputting an amplified UHF signal,
   a VHF amplifier circuit outputting an amplified VHF signal,
   a single mixer circuit provided in common both to said UHF and VHF amplifier circuits,
   a UHF local oscillator and a VHF local oscillator circuit which are selectably switched on, local oscillator signals from said UHF local oscillator circuit and said VHF local oscillator circuit being adapted to be selectably inputted to said mixer circuit respectively through a local-oscillator coupling capacitor,
   a first switching diode which can be switched on by supplying a first source voltage thereto through a first resistor, said first switching diode being so connected between said UHF amplifier circuit and said single mixer circuit that said amplified UHF signal is transmitted to said single mixer circuit only if said first switching diode is switched on,
   a second switching diode which can be switched on by supplying a second source voltage thereto through a second resistor, said second switching diode being so connected between said VHF amplifier circuit and said single mixer circuit that said amplified VHF signal is transmitted to said single mixer circuit only if said second switching diode is switched on,
   a first direct-current blocking capacitor through which said UHF amplifier circuit and said first switching diode are coupled,
   a second direct-current blocking capacitor through which both said first and second switching diodes are coupled with said single mixer circuit,
   a coupling capacitor through which said VHF amplifier circuit and said second switching diode are coupled, and
   an output terminal,
   wherein, if said tuner is in a UHF-reception mode of operation with a UHF signal being received by said UHF amplifier, said first switching diode receiving said first source voltage and being thereby switched on and said second switching diode being switched off, an amplified UHF signal outputted from said UHF amplifier circuit is transmitted through said first switching diode to said single mixer circuit, is mixed therein with a UHF local oscillator signal outputted from said UHF local oscillator circuit to be thereby converted into an UHF intermediate frequency signal and is outputted as said UHF intermediate frequency signal from said output terminal, and
   wherein, if said tuner is in a VHF-reception mode of operation with a VHF signal being received by said VHF amplifier, said second switching diode receiving said second source voltage and being thereby switched on and said first switching diode being switched off, an amplified VHF signal outputted from said VHF amplifier circuit is transmitted through said second switching diode to said single mixer circuit, is mixed therein with a VHF local oscillator signal outputted from said VHF local oscillator circuit to be thereby converted into an VHF intermediate frequency signal and is outputted as said VHF intermediate frequency signal from said output terminal.

2. The television tuner of claim 1 wherein said first switching diode is switched on by the application of a first source voltage sand said second switching diode is switched on by the application of a second source voltage.

* * * * *